United States Patent [19]

Pawlowski et al.

[11] Patent Number: 5,401,608
[45] Date of Patent: Mar. 28, 1995

[54] NEGATIVE-WORKING RADIATION-SENSITIVE MIXTURE AND RADIATION-SENSITIVE RECORDING MATERIAL PRODUCED THEREWITH

[75] Inventors: Georg Pawlowski, Wiesbaden, Germany; Ralph Dammel, Coventry, R.I.; Horst Roeschert, Ober-Hilbersheim, Germany; Winfried Meier, Frankfurt am Main, Germany; Walter Spiess, Dieburg; Klaus-Juergen Przybilla, Frankfurt am Main, Germany

[73] Assignee: Hoechst Aktiengesellschaft, Frankfurt am Main, Germany

[21] Appl. No.: 917,364

[22] Filed: Jul. 23, 1992

[30] Foreign Application Priority Data

Jul. 29, 1991 [DE] Germany .................. 41 25 042.7

[51] Int. Cl.$^6$ ............................................. G03C 1/492
[52] U.S. Cl. ................................... 430/270; 430/325; 430/330; 430/923
[58] Field of Search ............... 430/325, 330, 328, 923, 430/270

[56] References Cited

U.S. PATENT DOCUMENTS

| | | | |
|---|---|---|---|
| 3,692,560 | 9/1972 | Rosenkranz et al. | 117/93.31 |
| 4,840,867 | 6/1989 | Elsaesser et al. | 430/156 |
| 5,128,231 | 7/1992 | Itoh et al. | 430/270 |

FOREIGN PATENT DOCUMENTS

| | | |
|---|---|---|
| 164248 | 11/1985 | European Pat. Off. |
| 0232972 | 1/1987 | European Pat. Off. |
| 232972 | 8/1987 | European Pat. Off. |
| 0374856 | 12/1989 | European Pat. Off. |
| 0458325 | 5/1991 | European Pat. Off. |

OTHER PUBLICATIONS

F. M. Houlihan, et al., "An Evaluation of Nitrobenzyl Ester Chemistry for Chemical Amplification Resists", SPIE vol. 920, 1988, pp. 67–73.

J. V. Crivello, "Possibilities for Photoimaging Using Onium Salts", Polymer Engineering and Science, vol. 23, No. 17, Dec. 1983, pp. 953–956.

C. G. Willson, "Organic Resist Materials—Theory and Chemistry", Introduction to Microlithography ACS Symp. Ser. 219, 1983, pp. 88–159.

*Primary Examiner*—S. Rosasco
*Attorney, Agent, or Firm*—Foley & Lardner

[57] ABSTRACT

A negative-working radiation-sensitive mixture containing a) a compound which contains at least one —$CBr_3$ group bound to an atom not linked in turn to a hydrogen atom, b) an alkoxymethylated melamine and c) a water-insoluble polymeric binder which is soluble, or at least swellable, in aqueous alkaline solutions and contains phenolic OH groups, wherein (1) the mixture has an absorption of $<0.4$ $\mu m^{-1}$ at 248 nm, (2) the $CBr_3$ group of the compound a) is bound to the sulfur atom of a sulfonyl group and the compound a) is contained in the mixture in an amount of 0.2 to 10% by weight, based on the total amount of the components b) and c), (3) the ratio by mass of the components b) and c) is between 50:50 and 5:95 and (4) the component c) is a homopolymer or copolymer of hydroxystyrene or a derivative thereof, the homopolymer or copolymer having a removal rate of 200 to 3,000 nm/min at 21° C. in an aqueous alkaline developer containing 2.38% by weight of tetramethylammonium hydroxide, has excellent properties including high resistance to plasma etching, and outstanding lithographic properties and is useful in recording materials.

19 Claims, No Drawings

NEGATIVE-WORKING RADIATION-SENSITIVE MIXTURE AND RADIATION-SENSITIVE RECORDING MATERIAL PRODUCED THEREWITH

BACKGROUND OF THE INVENTION

1. Field of the Invention

The invention relates to a negative-working radiation-sensitive mixture containing a) a compound which contains at least one —$CBr_3$ group bound to an atom not linked in turn to a hydrogen atom and which forms a strong acid on exposure to actinic radiation, b) a compound containing at least two acid-crosslinkable groups, and c) a water-insoluble polymeric binder which is soluble, or at least swellable, in aqueous alkaline solutions and contains phenolic OH groups.

The invention furthermore relates to a radiationsensitive recording material which is produced therewith and which is suitable, in particular, for the production of photoresists and also for the manufacture of electronic components and printing plates or for chemical milling.

2. Description of Related Art

A plurality of lithographic techniques are currently used to produce microelectronic circuits. Using g-line lithography (436 nm), which is normally applied to conventional positive-working diazonaphthoquinone/-novolak formulations, it is possible to produce resist images having a resolution of down to 0.8 µm. Still finer structures (down to 0.5 µm) can advantageously be imaged on a resist layer with the aid of i-line lithography (365 nm). More recent modifications of i-line lithography such as, for example, phase-shifting mask technology, make it possible to reduce the structures to be imaged further, down to about 0.4 µm or less. A still higher resolution can be achieved with UV2 photoresists. In this connection, two irradiation techniques are used: the UV2 broadband exposure (approximately 240 to 260 nm) or exposure with KrF excimer lasers which emit at 248 nm.

The continuous reduction in the structures, for example, in chip production down to the region of less than 0.5 µm, requires modified lithographic techniques in which even negative-working photoresists are preferably used for specific applications. To image such fine structures short-wavelength radiation is used, such as high-energy UV light, electron beam radiation and X-rays. The radiation-sensitive mixture must be matched to the shortwave radiation. A list of the requirements imposed on the radiation-sensitive mixture is quoted in the paper by C. G. Willson entitled "Organic Resist Materials—Theory and Chemistry" [Introduction to Microlithography, Theory, Materials, and Processing, edited by L. F. Thompson, C. G. Willson, M. J. Bowden, ACS Symp. Ser., 219, 87 (1983), American Chemical Society, Washington]. There has therefore been an increased requirement for novel, in particular, negative-working, radiation-sensitive mixtures which can be used in the more modern technologies such as deep UV lithography [exposure, for example, to excimer lasers at wavelengths of 248 nm (KrF), and 193 nm (ArF)], electron beam lithography or X-ray lithography.

Negative-working radiation-sensitive mixtures which contain bisazides as crosslinking agents and binders derived from isoprene are known. They are used as radiation-sensitive layers in the production of printing plates, printed circuits and integrated circuits. Their use in microlithography is, however, limited by various technical disadvantages. Thus, it is difficult to produce high-quality layers without faults (pinholes). The heat resistance of such mixtures is inadequate, i.e., the resist images are distorted by thermal flux during the processing. Finally, their resolving power is limited to structures of >2 µm since they exhibit undesirably high swelling during the necessary development with organic solvents even in the cured regions, and this in turn results in structural distortions or inhomogeneous development processes and, consequently, in inaccurate reproduction of the image presented through the exposure mask.

In order to be able to produce resist images having a resolution of better than 2 µm, other negative-working radiation-sensitive mixtures have been developed which are sensitive to radiation of shorter wavelength, for example to high-energy UV radiation, electron beam radiation or X-rays. Such a mixture contains, for example, a copolymer of 2,3-epoxypropyl methacrylate and (2,3-dichloropropyl)methacrylate (DCOPA) or a combination of the corresponding homopolymers. However, the glass transition temperature of this mixture is too low for many applications, and, in particular, the low resistance of the mixture to plasma etching is to be criticized. In addition, this resist material also has to be processed with developers based on organic solvents with low environmental acceptability. A low resistance to plasma etching is also exhibited by other negative-working photoresists known hitherto and having a primarily aliphatic base.

EP-A 0 164 248 described an acid-curable mixture which can be developed in aqueous alkaline solutions, has an improved resistance to plasma etching as a result of the use of aromatics and is sensitive to near UV light (350 to 450 nm). In this case, the acid formers mentioned are, in particular, sulfonic acid ester derivatives of diazonaphthoquinone which form weakly acidic carboxylic acids on exposure and are therefore effective only at comparatively high concentration. As a consequence of the weak absorption and of the inadequate bleaching behavior of the photolytic acid former, such mixtures have, however, a low sensitivity to DUV radiation, electron beam radiation and X-rays.

U.S. Pat. No. 3,692,560 describes an acid-curable mixture which contains an acid-crosslinkable melamine derivative, a novolak and chlorinated benzophenones as photolytic acid formers. These mixtures do not have an adequate sensitivity in the deep UV range either. In addition, acid-curable mixtures containing photolytically formed hydrochloric acids as crosslinking catalysts often respond unusually sensitively to the smallest changes in the processing procedure, with the result that their practical use is limited.

The same applies to the acid-forming derivatives of DDT which are mentioned in EP-A 0 232 972 and which are highly toxic and for that reason alone cannot therefore be suitable for practical use. All the same, such compounds exhibit an appreciable sensitivity in the deep UV range (200 to 300 nm) and, when combined with polyhydroxystyrenes which are transparent in the UV range, yield radiation-sensitive mixtures having relatively good reproduction properties. The same patent also mentions certain aliphatically brominated cyanuric acid derivatives as photolytic acid donors. Since, however, these compounds may thermally eliminate hydrogen bromide, mixtures containing them have a limited shelf life.

Radiation-sensitive mixtures have furthermore been proposed which contain photolytic acid donors which form organic sulfonic acids on exposure. Examples are the bissulfonyl- or carbonylsulfonyldiazomethanes disclosed in the German Patent Application P 40 06 190.6, equivalent to U.S. patent application Ser. No. 07/661,823, filed Feb. 27, 1992 or the pyridones containing N-sulfonyloxy groups described in the patent applications P 41 12 967.9, P 41 12 966.0 and P 41 12 965.2, respectively, equivalent to U.S. Pat. Nos. 5,286,867; 5,229,254; and 5,230,985, each filed Apr. 20, 1992. Although practical results can also be achieved with the mixtures cited therein, there are a number of reasons why they do not make optimum image reproduction and processing possible: the bisarylsulfonyldiazomethanes mentioned in German Patent Application P 40 06 190.6 absorb relatively intensively in the deep UV2 range and do not therefore make it possible to provide resist materials which are both highly sensitive or produce orthogonal resist edges with small structures of $<0.35$ $\mu$m. The carbonylsulfonyldiazomethanes mentioned in the same documents do not yield adequate quantities of acid and the pyridones containing N-sulfonyloxy groups are relatively strong solubility inhibiters which prevent an adequate solubility gap between exposed and unexposed regions.

Further compounds which form a strong acid on irradiation with high-energy light are, in particular, onium salts, such as diazonium, phosphonium, sulfonium and iodonium salts of non-nucleophilic acids, such as $HSbF_6$, $HAsF_6$, or $HPF_6$ [described in J. V. Crivello, Polym. Eng. Sci., 23 (1983) 953]. In addition, halogen compounds, in particular chromophore-substituted trichloromethyltriazine derivatives, trichloromethyloxadiazole derivatives, o-(quinone diazide)sulfonyl chlorides and o-(quinone diazide)-4-sulfonates have been recommended.

These compounds are used in negative- or positive-working radiation-sensitive mixtures. The use of such photolytic acid formers entails, however, disadvantages which drastically restrict their possible uses in various fields of application. For example, many of the onium salts are toxic. Their solubility in many solvents is inadequate, and for this reason only a few solvents are suitable for producing a coating solution. In addition, when onium salts are used impurity atoms, some of which are undesirable, are introduced and these may result in process disturbances. This is a particular problem in microlithography. Furthermore, the onium salts form very highly corrosive Brønsted acids during photolysis. These acids attack sensitive substrates, with the result that the use of such mixtures leads to unsatisfactory results. The chlorine compounds and the quinonediazidesulfonylchlorides form hydrochloric acids, with the above-mentioned disadvantages. In addition, on certain substrates such compounds have only a limited durability. The durability has been improved by inserting an interlayer between substrate and radiation-sensitive layer, but this resulted in an undesirable increase in defects and in reduced reproducibility (See DE-A 36 21 376, equivalent to U.S. Pat. No. 4,840,867).

More recent work by F. M. Houlihan et al., *SPIE* 920: 67 (1988) showed on the basis of positive-working systems that, in addition to the above-mentioned acid formers, nitrobenzyl sulfonates, which form sulfonic acids having low migration tendency on exposure, can also be used in certain acid-labile resist formulations. From these results it can be deduced that such compounds can also be used for photocurable systems.

Despite the intensive research activity carried out hitherto in this area, no radiation-sensitive mixture is currently known which does not have the problems and disadvantages described above and with which a negative-working radiation-sensitive recording material can be produced which is capable of combining the advantageous properties described at the outset with one another.

SUMMARY OF THE INVENTION

An object of the invention was therefore to provide a radiation-sensitive mixture which combines the properties described at the outset with one another, without the known disadvantages.

It is also an object of the present invention to provide a recording material which contains such a radiation-sensitive mixture and to provide a process for producing such a recording material.

In accomplishing the foregoing objectives there has been provided, in accordance with one aspect of the present invention, a negative-working radiation-sensitive mixture having an absorption of $<0.4$ $\mu m^{-1}$ at 248 nm comprising:

a) 0.2 to 10% by weight based on the total amount of b) and c) of a compound which contains at least one tribromomethane sulfonyl group, wherein the compound forms a strong acid on exposure to actinic radiation, b) a compound containing at least two acid-crosslinkable groups, and c) as a water-insoluble polymeric binder which is soluble, or at least swellable, in aqueous alkaline solutions and contains phenolic OH groups, a homopolymer or copolymer of an alkylated or nonalkylated hyroxystyrene, the homopolymer or copolymer having a removal rate of 200 to 3,000 nm/min at 21° C. in an aqueous alkaline developer containing 2.38% by weight of tetramethylammonium hydroxide, wherein the ratio by mass of the components b) and c) is between 50:50 and 5:95.

In accordance with another aspect of the present invention there has been provided a radiation-sensitive recording material comprising a substrate and a radiation-sensitive layer situated thereon, wherein the radiation-sensitive layer comprises a radiation-sensitive mixture.

In accordance with another aspect of the present invention there has been provided a process for producing a recording material comprising dissolving the radiation-sensitive mixture in a solvent so as to form a solution, applying the solution to a substrate so as to form a radiation-sensitive layer on the substrate, and removing the solvent by evaporation.

Further objects, features, and advantages of the present invention will become apparent from the detailed description of preferred embodiments which follows.

DETAILED DESCRIPTION OF THE PREFERRED EMBODIMENTS

On exposure to actinic radiation, the compounds a) according to the present invention form reactive intermediates which are capable of initiating specific chemical reactions, for example free-radical polymerizations. However when they are irradiated, they form, in particular, strong acids which are able to catalyze reactions such as cationic polymerizations, crosslinkings or cleavages of acid-labile compounds or react with bases, which manifests itself, for example, in a color change with indicator dyestuffs.

Examples of compounds a) are, in particular tribromomethyl aryl sulfones, such as tribromomethyl phenyl sulfone, tribromomethyl p-tolyl sulfone, tribromomethyl 4-chlorophenyl sulfone and tribromomethyl 4-bromophenyl sulfone. A very particularly preferred compound of the type a) is tribromomethyl phenyl sulfone.

The compounds a) listed above preferably have absorption maxima in the range between 200 and 250 nm and are therefore very well suited for an irradiation with high-energy UV radiation in the UV2 range (220 to 280 nm).

The mixture according to the invention has a high thermal resistance and a high resistance to plasma etching, outstanding lithographic properties, such as high radiation sensitivity, wide processing tolerance and precise image reproduction even of the smallest structures, which corresponds to a resolution in the sub-semimicrometer range. After imagewise irradiation and subsequent development, an image of the mask which is faithful to detail is obtained. The resist areas have orthogonal edges. In the unirradiated regions, the resist layer is completely stripped on using the standard aqueous alkaline developers which contain 2.38% by weight of tetramethylammonium hydroxide, i.e., no layer residues or remains of any kind are left behind on the substrate. The acids formed during the photolysis result in an efficient crosslinking of the resist components b) and c) which makes it possible to produce highly sensitive, negative-working mixtures. Hence, by the term "strong acids" used above is meant acids which perform the desired crosslinking functions.

Recording materials produced with the mixtures according to the invention exhibit an image differentiation satisfying the highest requirements and an improvement in the contrast and the resolving power. The mixtures according to the invention make it possible, for example, to produce a highly sensitive negative-working photoresist for high-energy UV2 radiation (for example, 248 nm).

In addition, the compounds of the type a) can also be combined with other compounds which form strong acids including onium salts, other halogen compounds, in particular chromophore-substituted trichloromethyltriazine derivatives or trichloromethyloxadiazole derivatives, 1,2-disulfones, o-(quinone diazide)sulfonylchlorides or organometal/organohalogen combinations. Mixtures with bis(sulfonyl)diazomethanes and sulfonylcarbonyldiazomethanes are also suitable. In such mixtures, however, the disadvantages mentioned with these compounds at the outset may occur again.

The proportion of acid-forming compounds a) in the mixture according to the invention is varied depending on intended use, and is in general 0.2 to 10% by weight, preferably 0.5 to 8% by weight, based on the total weight of components b) and c) in the mixture.

Suitable acid-crosslinkable compounds b) include any known in the art and are, in particular, monomeric and oligomeric melamine/formaldehyde and urea/formaldehyde condensates. These condensates are described, for example, in EP-A 0 133 216, DE-A 36 34 371, and DE 37 11 264. They do not contain the tribromomethanesulfonyl groups which characterize compound a).

Preferred crosslinking agents are melamine/formaldehyde derivatives which contain two to six N-hydroxymethyl, N-alkoxymethyl or N-acyloxymethyl groups. In particular, the N-alkoxymethyl derivatives are suitable for use in the radiation-sensitive mixture according to the invention. Melamine derivatives which contain on average at least 3, in particular at least 3.5, alkoxymethyl groups are preferred since the shelf life of the radiation-sensitive mixture according to the invention is the best. The nature of the alkyl part of the alkoxymethyl groups is not particularly critical in this connection. The melamine derivatives may contain, in addition to methoxymethyl groups, also ethoxymethyl, propoxymethyl or butoxymethyl groups or mixtures thereof. Particularly preferred, however, are those derivatives which carry solely methoxymethyl groups. Various types of alkoxymethyl-substituted melamines are commercially available. Here reference may be made, in particular, to the products ®Cymel (Cyanamid Co.), ®Nicalacs (Sanwa Chemical Co.), ®Plastopal (BASF AG) or ®Maprenal (Hoechst AG).

At elevated temperatures, the melamine derivatives crosslink with the polymeric binders of the type c) under the influence of the photolytically produced acid produced from a). Generally they have the characteristic that they are able to form a carbonium ion under the temperature and acid conditions described below.

The proportion of the acid-crosslinkable compound b) in the radiation-sensitive mixture according to the invention may be varied according to intended use and is expediently 5 to 50% by weight, preferably 10 to 40% by weight, based in all cases on the total weight of the solid constituents of the mixture.

The radiation-sensitive mixture according to the invention furthermore contains at least one polymeric water-insoluble binder c) which is, however, soluble, or at least swellable, in aqueous alkaline solutions. Notable features of the binder are, in particular, that it has good compatibility with the other constituents of the radiation-sensitive mixture according to the invention, has as low as possible self-absorption, i.e., a high transparency, in the wavelength range from 220 to 280 nm, and is removed at a rate of 200 to 3000 nm/min at 21° C. in an aqueous alkaline developer containing 2.38% by weight of tetramethylammonium hydroxide.

Preferred binders are homo- and copolymers of 2-, 3- and 4-hydroxystyrene and of alkylated 2-, 3- and 4-hydroxystyrenes, in particular of alkylated 4-hydroxystyrenes, for example of 3-methyl-4-hydroxystyrene, of 2,3- and 3,5-dimethyl-4-hydroxystyrene. Particularly preferred are copolymers of alkylated and nonalkylated hydroxystyrenes, the proportion of nonalkylated hydroxystyrenes advantageously being no higher than 50% by weight. Compounds such as styrene and methyl (meth)acrylate can, however, also be used as comonomers. Mixtures (blends) of the above-mentioned polymers may furthermore be used. Blends of alkylated and nonalkylated polyhydroxystyrenes are again preferred, in which connection the proportion of nonalkylated polyhydroxystyrenes should not, if possible, exceed the 50% by weight mark in this case either. The polymers preferably have a molecular weight of 5000 to 50,000 g/mol, more preferably of 5000 to 35,000 g/mol.

The amount of binder may be varied depending on intended use of the mixture and is in general 40 to 95% by weight, preferably 50 to 90% by weight, based on the total weight of the solid components of the radiation-sensitive mixture.

The absorbance of the binder or of the combination of binders for radiation having a wavelength of about 220 to 250 nm, should preferably be less than 0.5, preferably less than 0.3 $\mu m^{-1}$.

Furthermore, dyes, pigments, plasticizers, wetting agents, leveling agents, and also polyglycols, cellulose ethers, for example ethylcellulose, may optionally be added to the radiation-sensitive mixtures according to the invention to fulfill specific requirements such as flexibility, adhesion and gloss.

If a substrate is to be coated with the inventive mixture, any known method can be used. Expediently the radiation-sensitive mixture is dissolved in a solvent or in a combination of solvents. Particularly suitable for this purpose are ethylene glycol and propylene glycol, and the mono- and dialkyl ethers derived therefrom, particularly the mono- and dimethyl ethers and the mono- and diethyl ethers, esters derived from aliphatic ($C_1-C_6$) carboxylic acids and either ($C_1-C_8$)alkanols or ($C_1-C_8$)alkanediols or ($C_1-C_6$)alkoxy($C_1-C_8$)alkanols, for example ethyl acetate, hydroxyethyl acetate, alkoxyethyl acetate, n-butyl acetate, propylene glycol monoalkyl ether acetate, in particular propylene glycol methyl ether acetate and amyl acetate, ethers such as tetrahydrofuran and dioxane, ketones such as methyl ethyl ketone, methyl isobutyl ketone, cyclopentanone and cyclohexanone, N,N-dialkylcarboxylic amides such as N,N-dimethylformamide and N,N-dimethylacetamide, and also hexamethylphosphoric triamide, N-methyl-2-pyrrolidinone and butyrolactone, and any desired mixtures thereof. Of these, the glycol ethers, aliphatic esters and ketones are particularly preferred.

Ultimately the choice of solvent or solvent mixture depends on the coating method used, the desired layer thickness and the drying conditions. The solvents must also be chemically inert towards the other coating constituents under the conditions applied.

The solution prepared with the solvents mentioned generally has a solids content of 5 to 60% by weight, preferably up to 50% by weight.

Finally, the invention also relates to a radiation-sensitive recording material that comprises a substrate and a radiation-sensitive layer situated thereon, composed of the radiation-sensitive mixture according to the invention.

Suitable substrates are all the materials from which capacitors, semiconductors, multilayer printed circuits or integrated circuits are composed or from which they can be produced. Specific mention should be made of silicon substrates which may also be thermally oxidized and/or coated with aluminum, and which may also be doped. In addition, all the other substrates standard in semi-conductor technology are possible, such as silicon nitride, gallium arsenide and indium phosphide. Furthermore, suitable substrates are those known from the production of liquid-crystal displays such as glass or indium tin oxide, and also metal plates and sheets (for example, composed of aluminum, copper, or zinc), bimetallic and trimetallic sheets, and also electrically nonconducting sheets which are vapor-coated with metals, and paper. These substrates may be thermally pretreated, superficially roughened, incipiently etched or pretreated with chemicals to improve desired properties, for example to increase the hydrophilic nature.

In order to impart a better cohesion to the radiation-sensitive layer and/or a better adhesion to the substrate surface, it may contain an adhesion promoter. The same effect can be achieved with an adhesion-promoting interlayer. In the case of silicon or silicon dioxide substrates, adhesion promoters of the aminosilane type such as, for example, 3-aminopropyltriethoxysilane or hexamethyldisilizane, are suitable for this purpose.

Suitable bases also include those for the production of photomechanical recording layers, such as printing forms for letterpress printing including, lithographic printing, screen printing and flexographic printing including, in particular, aluminum plates which may have previously been anodically oxidized, grained and/or silicatized, and in addition, zinc and steel plates which have optionally been chromium plated, and also plastic sheets and paper.

The recording material according to the invention is imagewise exposed to actinic radiation. Suitable radiation sources are, in particular, metal halide lamps, carbon arc lamps, xenon lamps and mercury vapor lamps. Exposure can also be carried out with high-energy radiation, such as laser radiation, electron beams or X-rays. Particularly preferred, however, are lamps capable of radiating light having a wavelength of 190 to 260 nm, i.e., in particular, xenon and mercury vapor lamps. In addition, laser light sources, for example excimer lasers, in particular KrF and ArF lasers which emit at 248 or 193 nm, respectively, can also be used. The radiation sources must have an adequate emission in the wavelength ranges mentioned.

The thickness of the light-sensitive layer on the substrate depends on the application purpose. In general, it is between 0.1 and 100 $\mu m$, preferably between 1 and 10 $\mu m$.

The invention furthermore relates to a process for producing a radiation-sensitive recording material. The radiation-sensitive mixture can be applied to the substrate by spraying-on, flow coating, rolling, spin coating or immersion coating. The solvent is then removed by evaporation, with the result that the radiation-sensitive layer remains behind on the surface of the substrate. The removal of the solvent can be promoted by heating the layer to temperatures of up to 150° C. However, the mixture may also first be applied in the above-mentioned manner to an intermediate base, from which it is transferred to the final base material under pressure and at elevated temperature. In principle, all the materials which are also suitable as base materials can be used as intermediate bases. The layer is then imagewise irradiated. After the irradiation, the layer is heated at a temperature of 90° to 140° C. for 30 to 300 s in order to sensitize the latent image. The layer is then treated with a developer solution which dissolves and removes the unirradiated regions of the layer, with the result that an image of the master used in the imagewise irradiation remains behind on the substrate surface.

The heating of the layer before development increases the sensitivity of the recording material according to the invention and is essential to produce extremely fine line patterns. If the heating step is carried out at temperatures which are too low, adequate sensitivity of the material is not achieved. On the other hand, temperatures which are too high can result in an impairment of the resolving power.

Suitable developers are, in particular, aqueous solutions which contain silicates, metasilicates, hydroxides, hydrogenphosphates and dihydrogenphosphates, carbonates or hydrogen carbonates of alkali metal, alkaline earth metal and/or ammonium ions, and also ammonia and the like. Developers free of metal ions are described in U.S. Pat. No. 4,141,733, 4,628,023, 4,729,941 and also in EP-A 0 023 758, 0 062 733 and 0 097 282. The content of these substances in the developer solution is in general 0.1 to 15% by weight, preferably 0.5 to 5% by weight, based on the weight of the developer solution. Developers which are free of metal ions are preferably used. Small amounts of a wetting agent may be added to the developers in order to facilitate the stripping of the soluble regions of the layer. Preferred developers include tetraalkylammonium hydroxides, especially tetramethylammonium hydroxide.

The developed layer structures may be postcured. In general, this is done by heating on a hotplate to a temperature below the flow point, followed by whole-surface exposure to the UV light of a xenon/mercury vapor lamp (range from 200 to 250 nm). The postcuring additionally crosslinks the image structures, with the result that they have, in general, a flow resistance up to temperatures above 200° C. The postcuring can also be carried out without increase in temperature, solely by irradiation with a high dose of high-energy UV light.

The radiation-sensitive mixture according to the invention can be used in the production of integrated circuits or of individual electrical assemblies using lithographic processes since it has a high photosensitivity, in particular when irradiated with light having a wavelength of between 190 and 300 nm. Since the mixtures bleach very well on exposure, finer structures can be achieved than is possible with the known mixtures. In these processes, the developed resist layer acts as a mask for the subsequent processing steps. Such steps are, for example, the etching of the layer base, the implantation of ions in the layer base or the deposition of metals or other materials on the layer base.

The examples described below illustrate the invention but are not intended to limit it. Hereinafter pbw stands for parts by weight and pbv for parts by volume. The relationship between pbw and pbv is the same as that between g and cm$^3$.

The radiation-sensitive mixtures according to the invention and their use as recording materials are investigated as follows and compared with previously described mixtures:

1. Determination of the sensitivity to UV radiation from a broadband light source, a filter which transmits radiation having a wavelength of 240 to 260 nm being placed in front of the light source, and to the radiation from a KrF excimer laser which emits at 248 nm. The specified measure of the sensitivity is the lowest irradiation dose (in mJ/cm$^2$) necessary to produce a residual film ratio of 0.8 in the irradiated regions. The residual film ratio is defined as the ratio of the film layer thickness after and before the development.

2. Determination of the developability with an aqueous alkaline developer containing 2.38% by weight of tetramethylammonium hydroxide and acting on the mixture for 120 seconds. In this measurement, a distinction is made between the following results in the development of trench patterns and line patterns having a spacing of 0.4 μm:

A) complete stripping of the resist layer in the unexposed regions and not more than 20% reduction of the film layer thickness in the exposed regions, B) complete stripping of the resist layer in the unexposed regions and more than 20% reduction in the film layer thickness in the exposed regions, C) incomplete stripping of the resist layer in the unexposed regions.

3. Determination of the cross-sectional shape of the line patterns by investigation with a scanning electron microscope. In this examination, a distinction is made between the shapes D) to G):

D) orthogonal edges and an at most slightly rounded shoulder,

E) undercut edges,

F) trapezoidal cross section and

G) trapezoidal cross section with so-called trailing edges.

4. Determination of the shelf life H) to I) of the solution of recording material:

H) no formation of visible precipitates and deviations in sensitivity of <5% compared with the sensitivity originally established after 120 days' storage at room temperature, I) visible precipitates and/or a deviation in the sensitivity of >5% compared with the sensitivity originally established after 120 days' storage.

5. Determination of the linearity K) to M) of the material: the exposure dose was chosen in such a way that 1.0 μm wide trenches and lines were reproduced on a 1:1 scale. Then 0.4 μm wide trenches and lines were measured with the same dose:

K) the deviation from the mask was <5%,

L) the deviation from the mask was <10%,

M) the deviation from the mask was >10%.

EXAMPLE 1

A homopolymer of 3-methyl-4-hydroxystyrene having an average molecular weight of 20,000 and a glass transition temperature of 135° C. was prepared using azobisisobutyronitrile as polymerization initiator. The removal rate of a film of pure polymer in an aqueous alkaline developer containing 2.38% of tetramethylammonium hydroxide was 350 nm/min.

A coating solution was prepared from 7.7 pbw of the polymer described above, 2.3 pbw of hexa-N-methoxymethylmelamine and 0.2 pbw of tribromomethyl phenyl sulfone in 42 pbw of propylene glycol monomethyl ether acetate.

The solution was filtered through a filter having a pore diameter of 0.1 μm and divided into two equal parts. Whereas one part was stored for 120 days at room temperature (21° C.) and was only then processed further in the manner described below, the second part was spun onto a wafer treated with an adhesion promoter (hexamethyldisilazane) at 3,000 revolutions immediately after filtration. After drying for 1 min at 100° C. on a hotplate, the layer thickness was 1.02 μm.

The recording material was imagewise exposed under a master using a KrF excimer laser and an energy of 15 mJ/cm$^2$, after a short storage it was afterheated for 1 min at 105° C. and then processed at 21° C. by immersion in an aqueous developer solution containing 2.38% by weight of tetramethylammonium hydroxide. After a development time of 120 seconds, a defect-free image of the mask (A) with high edge stability (D) was obtained, structures of <0.35 μm being resolved faithfully to detail and the width ratio (linearity of the resist) of nominally equal line/trench structures being virtually constant (K) in the range between 1 μm and 0.4 μm.

The second part of the solution was investigated for precipitates before further processing, the shelf-life classified as (H) and then filtered. The stored material also had a sensitivity of 15 mJ/cm².

EXAMPLE 2

A coating solution was prepared from
7.5 pbw of a 3-methyl-4-hydroxystyrene/4-hydroxystyrene copolymer (molar ratio 85:15) having an average molecular weight of 22,000,
2.5 pbw of hexa-N-methoxymethylmelamine and
0.4 pbw of tribromomethyl phenyl sulfone in
42 pbw of propylene glycol monomethyl ether acetate.

The solution was filtered through a filter having a pore diameter of 0.1 μm and spun onto a wafer treated with an adhesion promoter (hexamethyldisilazane) at 3,000 revolutions. After drying for 1 min at 90° C. on a hotplate, the layer thickness was 1.06 μm.

The recording material was imagewise exposed under a master with a xenon/mercury vapor lamp using an interference filter with radiation of 248±10 nm and an energy of 5 mJ/cm², after a short storage it was after-heated for 90 seconds at 110° C. and then processed with the developer described in Example 1.

After a development time of 120 seconds, a defect-free image of the mask (A) with high edge stability (D) was obtained, structures of <0.35 μm also being resolved faithfully to detail in this case. The shelf life of the solution was classed as (H).

EXAMPLE 3

A coating solution was prepared from
6.5 pbw of the homopolymer described in Example 1,
1.0 pbw of a homopolymer of 4-hydroxystyrene (Hoechst Celanese Corp.),
2.5 pbw of hexa-N-methoxymethylmelamine and
0.4 pbw of tribromomethyl phenyl sulfone in
42 pbw of propylene glycol monomethyl ether acetate.

The solution was filtered through a filter having a pore diameter of 0.1 μm and spun onto a wafer treated with an adhesion promoter (hexamethyldisilazane) at 3,000 revolutions. After drying for 1 min at 110° C. on a hotplate, the layer thickness was 1.03 μm.

The recording material was imagewise exposed under a master with a xenon/mercury vapor lamp using an interference filter with radiation of 248±10 nm and an energy of 4 mJ/cm², after storage for a short time it was afterheated for 90 seconds at 110° C. and then processed with the developer described in Example 1.

After a development time of 120 seconds, a defect-free image of the mask (A) with high edge stability (D), was obtained, structures of <0.35 μm also being resolved faithfully to detail in this case. The shelf life of the solution was also classified as (H).

EXAMPLES 4 TO 39 AND COMPARISON EXAMPLES 40 TO 52

The procedure in each of these examples was essentially as in Example 1, with the following differences: the type and amount of the composition and the molecular weight of the polymers, the type and amount of the melamine crosslinking agent, their ratio by mass to one another and the type and amount of the starter as specified in Table 2.

In Table 1 various polymer types are described, H standing for homopolymer, C for copolymer and B for blend (mixture of polymers). The further abbreviations have the following meanings:

2HS = 2-hydroxystyrene
3HS = 3-hydroxystyrene
4HS = 4-hydroxystyrene
3Me4HS = 3-methyl-4-hydroxystyrene
2,3DMe4HS = 2,3-dimethyl-4-hydroxystyrene
3,5DMe4HS = 3,5-dimethyl-4-hydroxystyrene
St = styrene
M1 = a methoxymethylated melamine having an average degree of methoxymethylation of >5.5
M2 = a methoxymethylated melamine having an average degree of methoxymethylation of 3.5
M3 = a methoxymethylated melamine having an average degree of methoxymethylation of 2.5
M4 = a butoxymethylated melamine having an average degree of butoxymethylation of >5.5
T1 = tribromomethyl phenyl sulfone
T2 = tribromomethyl 4-chlorophenyl sulfone
S1 = 4,6-bis(trichloromethyl)-2-(4-methoxy-phenyl)-1,3,5-triazine
S2 = 1,1-bis(4-chlorophenyl)-2,2,2-trichloroethane (described in EP-A 0 232 972)
S3 = bis(4-tertbutylphenylsulfonyl)diazomethane.

TABLE I

| Polymer | Type | Ratio | Molecular mass |
|---|---|---|---|
| 1 | H 2HS | 100 | 10000 |
| 2 | H 3Me4HS | 100 | 8000 |
| 3 | H 3Me4HS | 100 | 15000 |
| 4 | H 3Me4HS | 100 | 30000 |
| 5 | H 2,3DMe4HS | 100 | 9000 |
| 6 | H 3,5DMeRHS | 100 | 12000 |
| 7 | C 2HS/4HS | 85:15 | 12000 |
| 8 | C 3Me4HS/4HS | 95:15 | 18000 |
| 9 | C 3Me4HS/4HS | 90:10 | 15000 |
| 10 | C 3Me4HS/4HS | 90:10 | 22000 |
| 11 | C 3Me4HS/4HS | 80:20 | 22000 |
| 12 | C 3Me4HS/3HS | 85:15 | 20000 |
| 13 | C 2,3DMe4HS/4HS | 85:15 | 12000 |
| 14 | C 3,5DMe4HS/4HS | 80:20 | 14000 |
| 15 | B 2HS/4HS | 80:20 | 10000/20000 |
| 16 | B 3Me4HS/4HS | 95:5 | 22000/20000 |
| 17 | B 3Me4HS/4HS | 90:10 | 22000/20000 |
| 18 | B 3Me4HS/4HS | 80:20 | 22000/20000 |
| 19 | B 3Me4HS/3HS | 85:15 | 22000/20000 |
| 20 | B 2,3DMe4HS/4HS | 85:15 | 9000/20000 |
| 21 | B 3,5DMe4HS/4HS | 80:20 | 12000/20000 |
| 22 | H 4HS | 100 | 20000 |
| 23 | C 4HS/ST | 80:20 | 25000 |
| 24 | C 2HS/4HS | 20:80 | 16000 |
| 25 | C 3HS/HS | 40:60 | 16000 |

| Example | Polymer | Melamine | Ratio | Starter |
|---|---|---|---|---|
| 4 | 1 | M1 | 75:25 | T1 3% |
| 5 | 2 | M1 | 90:10 | T1 2% |
| 6 | 2 | M1 | 80:20 | T1 2% |
| 7 | 2 | M1 | 80:20 | T1 4% |
| 8 | 2 | M2 | 80:20 | T1 2% |
| 9 | 2 | M3 | 80:20 | T1 2% |
| 10 | 2 | M4 | 80:20 | T1 2% |
| 11 | 3 | M1 | 80:20 | T1 2% |
| 12 | 4 | M1 | 80:20 | T1 2% |
| 13 | 5 | M1 | 80:20 | T1 2% |
| 14 | 6 | M1 | 80:20 | T1 2% |
| 15 | 7 | M1 | 80:20 | T1 2% |
| 16 | 8 | M1 | 85:15 | T1 2% |
| 17 | 8 | M1 | 75:25 | T1 2% |
| 18 | 8 | M1 | 80:20 | T1 4% |
| 19 | 9 | M1 | 80:20 | T1 2% |
| 20 | 9 | M2 | 80:20 | T1 2% |

-continued

| | Polymer | Melamine | Ratio | Starter |
|---|---|---|---|---|
| 21 | 10 | M1 | 80:20 | T1 2% |
| 22 | 10 | M2 | 80:20 | T1 2% |
| 23 | 11 | M1 | 80:20 | T1 2% |
| 24 | 12 | M1 | 80:20 | T1 2% |
| 25 | 13 | M1 | 80:20 | T1 4% |
| 26 | 14 | M1 | 80:20 | T1 2% |
| 27 | 15 | M2 | 80:20 | T1 2% |
| 28 | 16 | M1 | 80:20 | T1 2% |
| 29 | 16 | M2 | 80:20 | T1 2% |
| 30 | 17 | M1 | 75:25 | T1 2% |
| 31 | 17 | M1 | 80:20 | T1 2% |
| 32 | 17 | M2 | 80:20 | T1 2% |
| 33 | 17 | M1 | 80:20 | T1 4% |
| 34 | 17 | M2 | 80:20 | T1 4% |
| 35 | 18 | M1 | 80:20 | T1 4% |
| 36 | 18 | M1 | 80:20 | T1 2% |
| 37 | 19 | M1 | 80:20 | T1 2% |
| 38 | 20 | M2 | 80:20 | T1 2% |
| 39 | 21 | M2 | 80:20 | T1 2% |
| Comparison Examples | | | | |
| 40 | 3 | M1 | 80:20 | S1 2% |
| 41 | 3 | M1 | 80:20 | S2 2% |
| 42 | 3 | M1 | 80:20 | S3 2% |
| 43 | 3 | M4 | 80:20 | S3 2% |
| 44 | 22 | M1 | 80:20 | T1 2% |
| 45 | 22 | M1 | 80:20 | T1 4% |
| 46 | 22 | M1 | 80:20 | S1 4% |
| 47 | 22 | M1 | 80:20 | S2 4% |
| 48 | 22 | M2 | 80:20 | T1 4% |
| 49 | 22 | M4 | 80:20 | T1 4% |
| 50 | 22 | M3 | 80:20 | T1 2% |
| 51 | 23 | M1 | 80:20 | T1 2% |
| 52 | 24 | M1 | 80:20 | T1 2% |

The polymers 22–24 employed in the comparative examples 44–52 show a removal rate of more than 3,000 nm/min at 21° C. in an aqueous alkaline developer containing 2,38% by weight of tetramethylammonium hydroxide.

Table 3 summarizes the observed investigation results for the radiation-sensitive mixtures of the examples described above. In this table, the abbreviations have the following meanings:

Ex. = Example No.
Sens. = sensitivity in mJ/cm² (Lambda Physics KrF excimer laser),
ReF. = residual film thickness after development, in %,
Dev. = the type of development
Xsh = cross-sectional shape of the lines remaining (0.4 μm)
SL = shelf life
Lin. = linearity

TABLE III

| | Sens. | ReF. | Dev. | Xsh. | SL | Lin. |
|---|---|---|---|---|---|---|
| Ex. | | | | | | |
| 4 | 12 | 94 | A | D | H | L |
| 5 | 35 | 90 | A | D | H | K |
| 6 | 20 | 92 | A | D | H | K |
| 7 | 5 | 92 | A | D | H | K |
| 8 | 22 | 94 | A | D | H | K |
| 9 | 22 | 85 | A | F | H | L |
| 10 | 25 | 82 | A | F | I | L |
| 11 | 20 | 90 | A | D | H | K |
| 12 | 18 | 90 | A | D | H | K |
| 13 | 22 | 87 | A | F | H | L |
| 14 | 25 | 86 | A | F | H | L |
| 15 | 32 | 92 | A | F | — | L |
| 16 | 21 | 87 | A | F | H | L |
| 17 | 24 | 92 | A | D | H | K |
| 18 | 5 | 91 | A | D | H | K |
| 19 | 18 | 94 | A | D | H | K |
| 20 | 18 | 92 | A | D | H | K |
| 21 | 16 | 89 | A | F | H | L |
| 22 | 16 | 88 | A | F | H | L |
| 23 | 15 | 92 | A | G | H | L |
| 24 | 20 | 87 | A | F | H | L |
| 25 | 7 | 92 | A | F | H | L |
| 26 | 32 | 86 | A | F | H | L |
| 27 | 19 | 91 | A | E | H | L |
| 28 | 18 | 92 | A | E | H | L |
| 29 | 18 | 95 | A | D | H | K |
| 30 | 20 | 95 | A | D | H | K |
| 31 | 18 | 93 | A | D | H | K |
| 32 | 18 | 92 | A | D | H | K |
| 33 | 8 | 90 | A | D | H | K |
| 34 | 9 | 92 | A | D | H | K |
| 35 | 6 | 89 | A | D | H | K |
| 36 | 15 | 90 | A | D | H | K |
| 37 | 20 | 85 | A | F | H | L |
| 38 | 23 | 88 | A | F | H | L |
| 39 | 18 | 89 | A | F | H | L |
| Comparison Examples | | | | | | |
| 40 | 20 | 85 | C | G | H | L |
| 41 | 34 | 89 | A | G | H | L |
| 42 | 55 | 90 | C | G | H | L |
| 43 | 60 | 87 | C | G | I | M |
| 44 | 14 | 56 | B | E | H | M |
| 45 | 6 | 87 | B | E | H | M |
| 46 | 10 | 86 | B | E | H | M |
| 47 | 8 | 84 | B | E | H | M |
| 48 | 7 | 87 | B | E | H | M |
| 49 | 11 | 82 | B | E | I | M |
| 50 | 25 | 78 | B | E | H | M |
| 51 | 15 | 96 | C | G | H | M |
| 52 | 18 | 91 | B | E | H | M |

What is claimed is:

1. A negative-working radiationsensitive mixture having an absorption of <0.4 μm$^{-1}$ at 248 nm comprising a) 0.2 to 10% by weight based on the total amount of b) and c) of a compound which contains at least one tribromomethane sulfonyl group, wherein the compound forms an acid on exposure to actinic radiation, b) a compound containing at least two acid-crosslinkable groups, and c) a water-insoluble polymeric binder which is soluble, or at least swellable, in aqueous alkaline solutions and which contains phenolic OH groups, wherein the polymeric binder is selected from a homopolymer, copolymer, or blend thereof, of an alkylated or nonalkylated hyroxystyrene, the homopolymer, copolymer or blend having a removal rate of 200 to 3,000 nm/min at 21° C. in an aqueous alkaline developer containing 2.38% by weight of tetramethylammonium hydroxide, wherein the ratio by mass of the components b) and c) is between 50:50 and 5:95.

2. A negative-working radiation-sensitive mixture as claimed in claim 1, wherein the compound a) is a tribromomethyl aryl sulfone.

3. A negative-working radiation-sensitive mixture as claimed in claim 2, wherein the tribromomethyl aryl sulfone is selected from the group consisting of tribromomethyl phenyl sulfone, tribromomethyl p-tolyl sulfone, tribromomethyl 4-chlorophenyl sulfone and tribromomethyl 4-bromophenyl sulfone.

4. A negative-working radiation-sensitive mixture as claimed in claim 3, wherein the tribromomethyl aryl sulfone is tribromomethyl phenyl sulfone.

5. A negative-working radiation-sensitive mixture as claimed in claim 1, wherein compound b) comprises an alkoxymethylated or acyloxymethylated melamine.

6. A negative-working radiation-sensitive mixture as claimed in claim 5, wherein b) is an alkoxymethylated melamine containing at least 3 alkoxymethyl groups.

7. A negative-working radiation-sensitive mixture as claimed in claim 1, wherein b) comprises a methoxymethylated melamine.

8. A negative-working radiation-sensitive mixture as claimed in claim 1, comprising 5 to 50% by weight of compound b) based on the total solids content of the mixture.

9. A negative-working radiation-sensitive mixture as claimed in claim 1, wherein binder c) is an alkylated polyhydroxystyrene.

10. A negative-working radiation-sensitive mixture as claimed in claim 1, wherein binder c) is a copolymer.

11. A negative-working radiation-sensitive mixture as claimed in claim 10, wherein said copolymer is a copolymer of alkylated and non-alkylated hydroxystyrene.

12. A negative-working radiation-sensitive mixture as claimed in claim 1, wherein binder c) is a blend of an alkylated and a non-alkylated polyhydroxystyrene.

13. A negative-working radiation-sensitive mixture as claimed in claim 1, comprising 50 to 95% by weight of binder c) based on the total solids content of the mixture.

14. A radiation-sensitive recording material comprising a substrate and a radiation-sensitive layer situated thereon, wherein the radiation-sensitive layer comprises a radiation-sensitive mixture as claimed in claim 1.

15. A process for producing a recording material as claimed in claim 14 comprising dissolving said radiation-sensitive mixture in a solvent so as to form a solution, applying the solution to the substrate so as to form a radiation-sensitive layer on the substrate, and removing the solvent by evaporation.

16. A process for producing an image comprising the steps of irradiating the radiation-sensitive layer of a recording material as claimed in claim 14 imagewise under a master, sensitize the layer by heating to a temperature of 90° to 140° C. for 30 to 300 seconds, and developing the sensitize layer with a developer solution which removes the unirradiated region of the layer leaving a negative image of the master used in the imagewise irradiation.

17. A process as claimed in claim 16 further comprising post-curing the negative image.

18. The process of claim 16, wherein said step of irradiating the radiation sensitive layer imagewise under a master uses an energy of from 4–35 mJ/cm$^2$.

19. A negative-working radiation sensitive mixture as claimed in claim 1, wherein said compound a) is present in an amount of from 2–4% by weight, based on the total weight of b) and c) in the mixture.

* * * * *